US006864675B2

(12) United States Patent
Shigeta

(10) Patent No.: US 6,864,675 B2
(45) Date of Patent: Mar. 8, 2005

(54) MARK FORMING METHOD, MARK FORMING APPARATUS AND ANALYZING APPARATUS

(75) Inventor: Shinobu Shigeta, Tateyama (JP)

(73) Assignee: Nippon Foundry Inc. (JP)

( * ) Notice: Subject to any disclaimer, the term of this patent is extended or adjusted under 35 U.S.C. 154(b) by 208 days.

(21) Appl. No.: 09/954,661

(22) Filed: Sep. 17, 2001

(65) Prior Publication Data

US 2002/0084779 A1 Jul. 4, 2002

(30) Foreign Application Priority Data

Dec. 22, 2000 (JP) ........................................ 2000-391074

(51) Int. Cl.[7] .............................................. G01R 31/02
(52) U.S. Cl. .................................. 324/158.1; 324/754
(58) Field of Search .............................. 324/758, 158.1, 324/754, 765, 760, 755

(56) References Cited

U.S. PATENT DOCUMENTS 3,507,389 A * 4/1970 Casner et al. ............... 209/636
3,572,400 A * 3/1971 Casner et al. ................... 141/1
4,568,879 A * 2/1986 Nakamura et al. .......... 324/759
4,992,729 A * 2/1991 Nadeau ....................... 324/765
5,474,640 A * 12/1995 Ye et al. .................. 156/345.43

FOREIGN PATENT DOCUMENTS

JP          02-122536        10/1990

* cited by examiner

Primary Examiner—Kamand Cuneo
Assistant Examiner—Jimmy Nguyen
(74) Attorney, Agent, or Firm—Synnestvedt, Lechner & Woodbridge, LLP; Richard C. Woodbridge, Esq; Stuart H. Nissim, Esq.

(57) ABSTRACT

A mark forming apparatus including a guide needle for forming a mark, a positioning mechanism, a solution supply device, and a heating unit is disclosed. The positioning mechanism is used for positioning the guide needle above a fault location of a semiconductor device. The solution supply device supplies a solution containing a coloring agent and a volatile solvent to the fault location until it touches a tip of the guide needle. The heating unit evaporates the volatile solvent to form a mark consisting of the coloring agent surrounding the fault location.

20 Claims, 6 Drawing Sheets

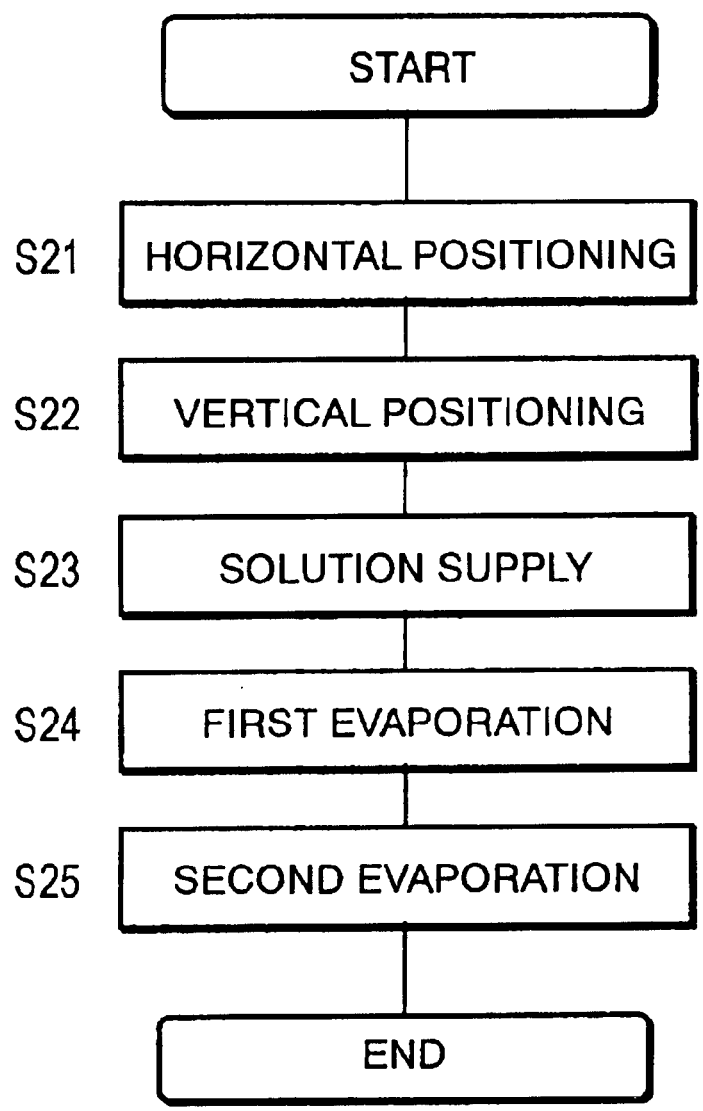

FIG. 8A
FIG. 8B
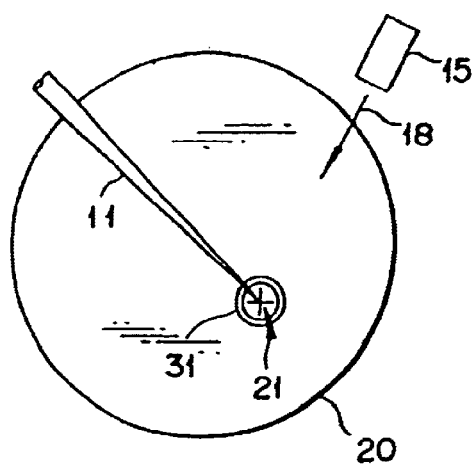
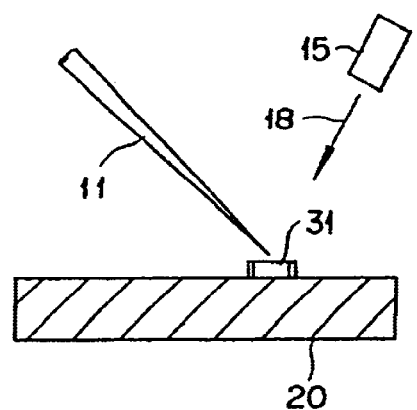

MARK FORMING METHOD, MARK FORMING APPARATUS AND ANALYZING APPARATUS

BACKGROUND OF THE INVENTION

1. Field of the Invention

The invention is related to a method and apparatus for forming marks on semiconductor devices.

2. Description of the Related Art

Since the production volume of a semiconductor device is enormously large, a drop in the production yield caused by defects can affect the profitability substantially. Therefore, the analysis of the cause of defects, i.e., the analysis of the locations where defects are occurring is of primary importance to a manufacturer.

In the fault analysis of semiconductor devices, physical processes are applied to fault locations to make the observation and analysis of fault locations easier. Thus, it is necessary to mark the fault locations prior to applications of physical processes.

However, this marking or mark forming has hitherto been made by physically damaging semiconductor devices by means of thermal energy delivered by laser rays. As a result, once this marking is done, the electrical characteristics of the semiconductor devices change and it makes it impossible to repeat the measurement of the electrical characteristics. In other words, it presents a problem that it is impossible to obtain efficiently the multi-faceted fault mechanism.

SUMMARY OF THE INVENTION

It is therefore a general object of this invention to provide an apparatus and a method for marking fault locations of semiconductor devices without affecting electrical characteristics.

It is a more specific object of this invention to provide a mark forming apparatus including a guide needle for forming a mark, a positioning mechanism, a solution supply device, and a heating unit. The positioning mechanism is used for positioning the guide needle above a fault location of a semiconductor device. The solution supply device supplies a solution containing a coloring agent and a volatile solvent to the fault location until it touches a tip of the guide needle. The heating unit evaporates the volatile solvent to form a mark consisting of the coloring agent surrounding the fault location.

A further object of this invention is to provide a mark forming method including the steps of positioning a guide needle for forming a mark above a fault location of a semiconductor device, supplying a solution containing a coloring agent and a volatile solvent to the fault location until it touches a tip of the guide needle, and evaporating the volatile solvent to form a mark consisting of the coloring agent surrounding the fault location.

Still a further object of this invention is to provide an analyzing apparatus including a detector for detecting fault locations of semiconductor devices, a measuring instrument and an observation device, in particular, an analyzing apparatus additionally having a marking capability equipped with a probe needle used for the measuring instrument, a positioning mechanism, a solution supply device and a heating unit. The observation device is used for observing and identifying a location of the probe needle. The positioning mechanism is used for positioning the probe needle above the fault location as detected. The solution supply device supplies a solution containing a coloring agent and a volatile solvent to the fault location until it touches a tip of the probe needle. The heating unit evaporates the volatile solvent to form a mark consisting of the coloring agent surrounding the fault location.

The objects, features, and characteristics of this invention other than those set forth above will become apparent from the description given herein below with reference to preferred embodiments illustrated in the accompanying drawings.

BRIEF DESCRIPTION OF THE DRAWINGS

FIG. 3 is a flow diagram of a mark forming process shown in FIG. 2;

FIG. 8A and FIG. 8B are a plan view and a sectional view of assistance in explaining a second evaporation step shown in FIG. 3.

DETAILED DESCRIPTION OF THE PREFERRED EMBODIMENTS

The embodiments of this invention will be described below with reference to the accompanying drawings.

Figure 1:
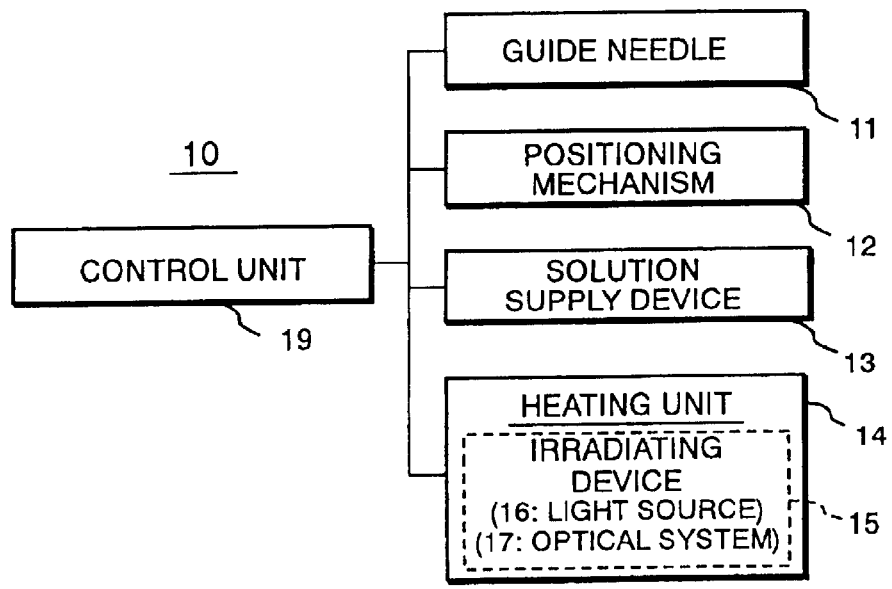
FIG. 1 is a block diagram of a mark forming apparatus according to the first embodiment.

As shown in FIG. 1, the mark forming apparatus 10 according to the first embodiment has a guide needle 11, a positioning mechanism 12, a solution supply device 13, a heating unit 14, and a control unit 19. The control unit 19 is used for controlling the above parts 11 through 14.

The guide needle 11 has a diameter of 5 $\mu$m and a length of approximately 20 mm, and is used as a guide for marking the fault locations of semiconductor devices. Since the guide needle may be used also as a probe needle, it is easy and inexpensive to build the mark forming apparatus into an analyzing apparatus that has a probe needle.

The positioning mechanism 12 is used for placing the guide needle 11 above the fault locations of semiconductor devices.

The solution supply device 13 is used for supplying a solution containing a coloring agent and a volatile solvent to a fault location until it touches on the tip of the guide needle 11. The volatile solvent to be used can be anything as long as it does not damage a semiconductor device 20 and the coloring agent is uniformity dispersed in it. For example, the coloring agent is ink and the volatile solvent is ketone, ether, or alcohol.

The heating unit 14 is used for evaporating the volatile solvent to form a mark consisting of the coloring agent surrounding the fault location. More specifically, the heating unit 14 has an irradiating device 15 for irradiating visible rays and the evaporation of volatile solvent is induced by the irradiation with visible rays. Consequently, the constitution of the heating unit 14 can be simplified as the volatile solvent is evaporated by means of visible rays that are easier to apply.

For the purpose of evaporating the volatile solvent by visible rays, high volatility is inappropriate. For example, lower alcohol such as isopropyl alcohol is preferable as a volatile solvent as it has an appropriate volatility and can form ring-like marks.

The irradiating device 15 is equipped with a light source 16 that generates visible rays and an optical system 17 having an objective lens, and produces spot-irradiation with visible rays. Since a microscope has a light source that generates visible rays and an optical system with an objective lens, it can be used as the irradiating device. Therefore, it is easy and inexpensive to build a mark forming apparatus as an integral part of an analyzing apparatus equipped with a microscope. The light source 16 is, for example, a halogen lamp.

Figure 2:
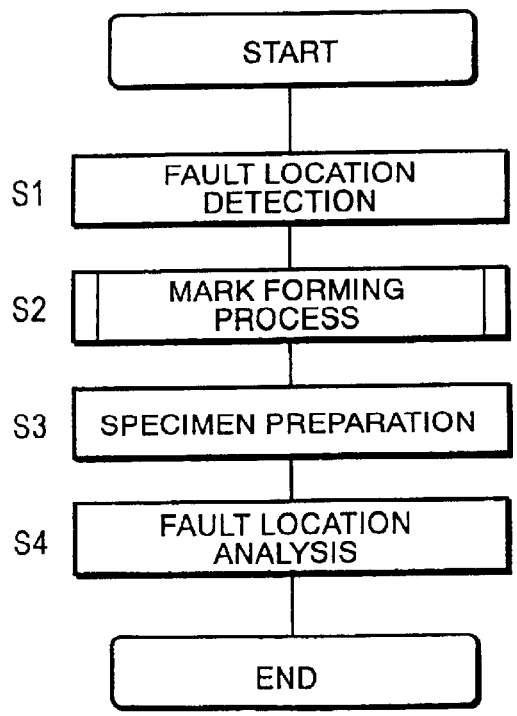
FIG. 2 is a general flow diagram of the fault analysis of semiconductor devices.

Next, the fault analysis of the semiconductor device will be described with reference to FIG. 2.

First, a fault is detected by, for example, electrical measurement of a probe needle test, and a fault location is identified (step S1). Next, the mark forming process is performed to mark the detected fault location (step S2).

Then, physical processes such as etching and polishing are applied to the fault location identified by marking to prepare specimens for a fault analysis (step S3).

Finally, by observing and analyzing the prepared specimens, the fault location is analyzed (step S4). Various devices for fault analysis using physical phenomena related to causes of faults exist. For example, there are analyzing apparatuses using the hot emission method for identifying the locations of hot electron light emission and using the liquid crystal method for identifying the locations of high resistance heating.

Next, the mark forming process of the step S2 will be described.

The mark forming process includes, as shown in FIG. 3, a horizontal positioning step (S21), a vertical positioning step (S22), a solution supply step (S23), a first evaporation step (S24), and a second evaporation step (S25).

Figure 4A:
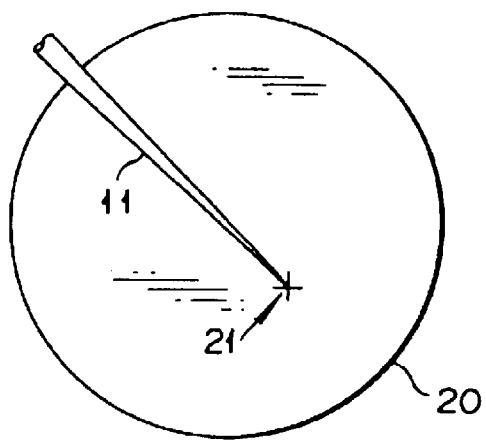
FIG. 4A and FIG. 4B are a plan view and a sectional view of assistance in explaining a horizontal positioning step shown in FIG. 3.
Figure 4B:
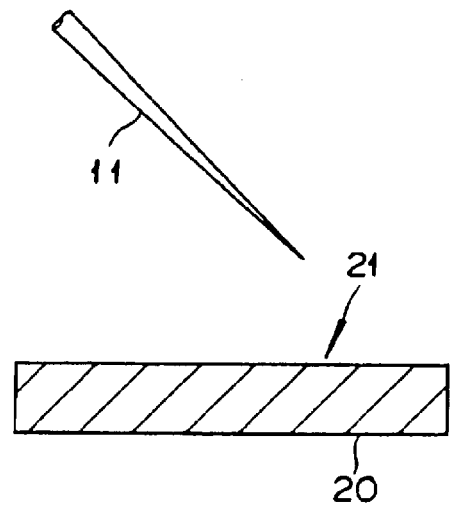

In the horizontal positioning step (S21), horizontal positioning of the guide needle 11 is executed by means of visual observation using a microscope to place the guide needle 11 above a fault location 21 of the semiconductor device 20 as shown in FIG. 4A and FIG. 4B.

Figure 5A:
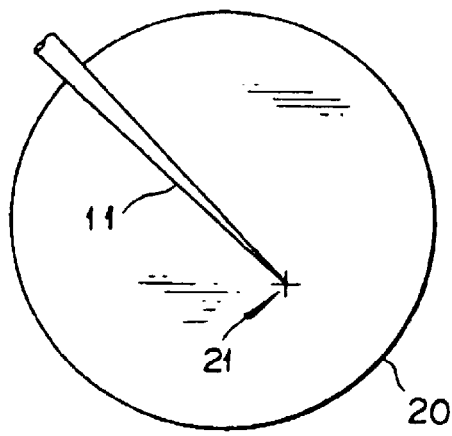
FIG. 5A and FIG. 5B are a plan view and a sectional view of assistance in explaining a vertical positioning step shown in FIG. 3.
Figure 5B:
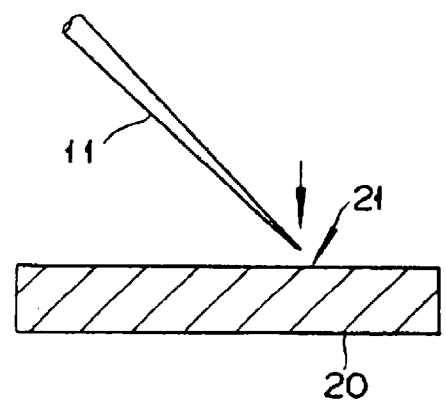

Next, in the vertical positioning step (S22), as shown in FIG. 5A and FIG. 5B, vertical positioning of the guide needle 11 is executed by means of visual observation using the microscope to place the guide needle 11 close to but not touching the fault location 21 of the semiconductor device 20.

Thus, the guide needle 11 for forming a mark is placed close to and above the fault location 21 of the semiconductor device 20 by means of the above steps (S21, S22).

Figure 6A:
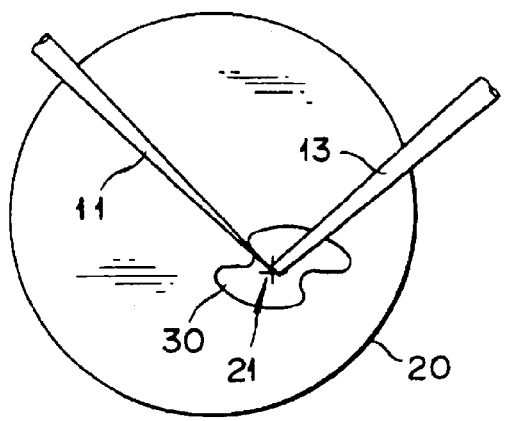
FIG. 6A and FIG. 6B are a plan view and a sectional view of assistance in explaining a solution supply step shown in FIG. 3.
Figure 6B:
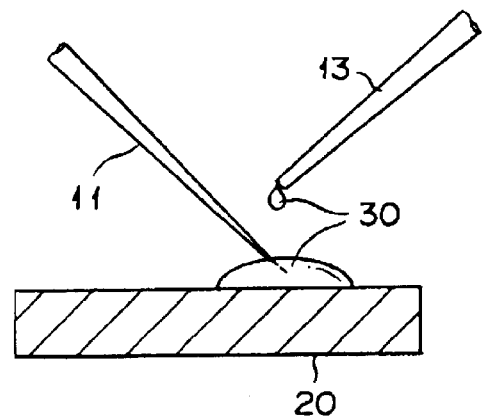

Next, at the solution supply step (S23), a solution 30 containing the coloring agent and the volatile solvent is supplied to the fault location 21 until it touches the tip of the guide needle 11 as shown in FIG. 6A and FIG. 6B.

Figure 7A:
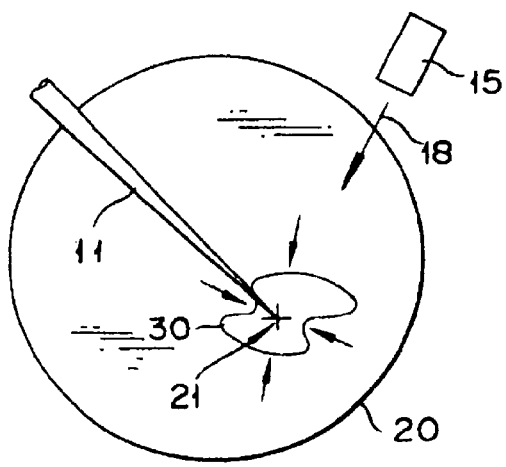
FIG. 7A and FIG. 7B are a plan view and a sectional view of assistance in explaining a first evaporation step shown in FIG. 3.
Figure 7B:
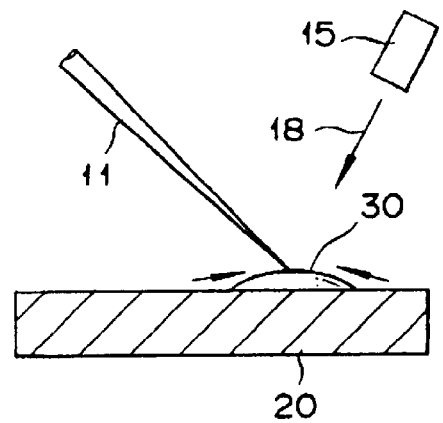

At the first evaporation step (S24), the evaporation of the volatile solvent begins as shown in FIG. 7A and FIG. 7B due to visible rays (irradiating rays) 18 from the irradiating device 15 of the heating unit 14. In other words, the visible rays generated by the light source 16 passes through the optical system 17 having the objective lens and irradiates the solution 30 to raise the temperature of the solution 30. As a consequence, the volatile solvent in the solution 30 evaporates. The solution 30 gathers to the tip of the guide needle 11 located above the fault location 21 of the semiconductor device 20 because of its surface tension as the evaporation of the volatile solvent progresses.

Lastly, at the second evaporation step (S25), the evaporation of the volatile solvent further progresses as shown in FIG. 8A and FIG. 8B, to form a mark 31 consisting of the coloring agent to surround the fault location 21.

More specifically, as the contact between the solution 30 and the tip of the guide needle 11 disappears with the progress of the evaporation of the volatile solvent contained in the solution 30, the solution 30 spreads out in a ring-like shape due to its surface tension, and the remaining volatile solvent evaporates all at once. Thus, a mark 31 consisting of the coloring agent contained in the solution 30 is formed surrounding the fault location 21. The mark 31 formed is very tiny and is capable of identifying the fault location 21 at a level finer than 1 $\mu$m.

Thus, the volatile solvent is evaporated and a mark consisting of the coloring agent is formed surrounding the fault location by the above steps (S24, S25).

In the first embodiment as stated above, the solution gathers to the tip of the guide needle located above the fault location because of its surface tension, the contact between the solution and the tip of the guide needle disappears with the progress of the evaporation of the volatile solvent contained in the solution, the solution spreads out in a ring-like shape, and finally a tiny mark consisting of the coloring agent contained in the solution is formed surrounding the fault location.

The volatile solvent can be evaporated without using high energy rays such as laser rays that might physically damage semiconductor devices. In other words, it is possible to form marks without affecting the electrical characteristics of semiconductor devices. Therefore, the electrical characteristics of the semiconductor devices can be measured again after mark forming so that information of multi-faceted fault mechanism can be obtained more efficiently.

Next, the second embodiment will be described.

Figure 9:
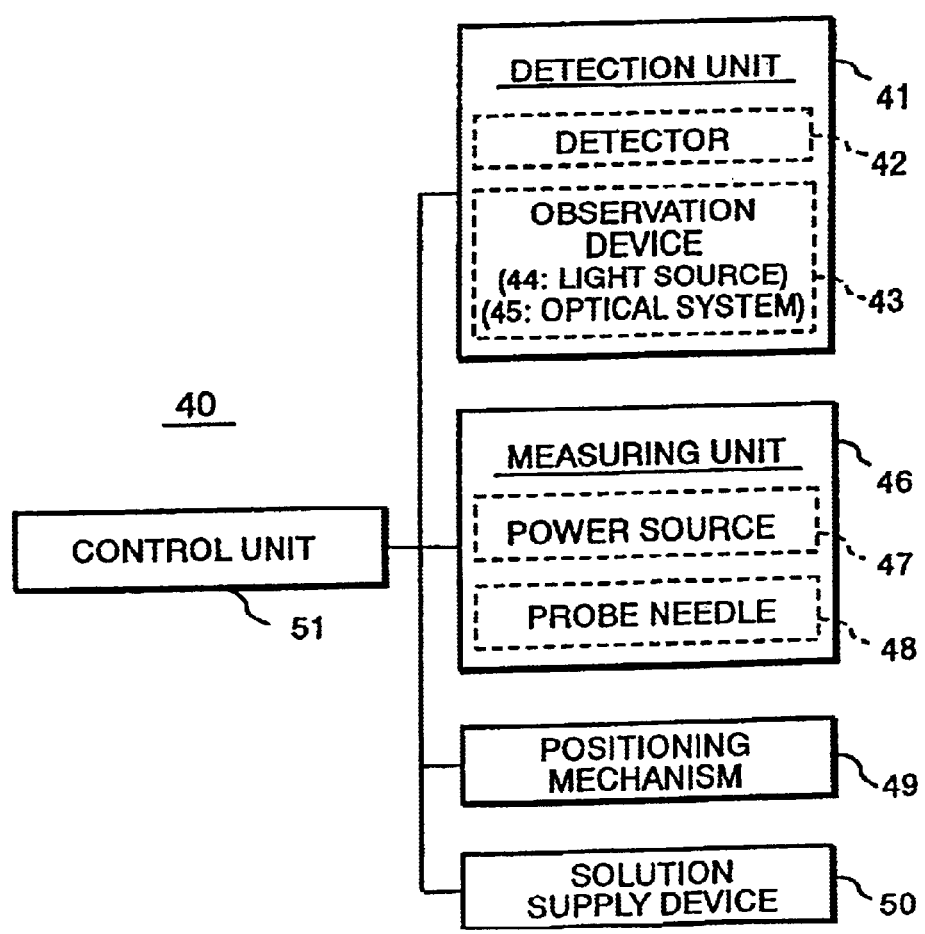
FIG. 9 is a block diagram of an analyzing apparatus according to the second embodiment.

As shown in FIG. 9, an analyzing apparatus 40 according to the second embodiment includes a detection unit 41, a measuring unit 46, a positioning mechanism 49, a solution supply device 50, and a control unit 51. The control unit 51 is used for controlling the above parts 41, 46, 49 and 50.

The detection unit 41 includes a detector 42 for detecting physical phenomena that are specific to fault locations of semiconductor devices, and an observation device 43 for identifying physical phenomena specific to fault locations. The observation device 43 is equipped with a microscope that has a light source 44 for generating visible rays and an optical system 45 including an objective lens. The microscope is also used as an irradiating device (heating unit) for irradiating visible rays.

The measuring unit 46 includes a power source 47 for measuring the electrical characteristics of the semiconductor device and a probe needle 48 for applying voltage on a pad. The probe needle 48 is used as a guide needle for forming a mark as well.

The positioning mechanism 49 is used for positioning the probe needle 48 on the specified location, for example, above detected fault location.

The solution supply device 50 is used for supplying the solution that contains the coloring agent and the volatile solvent to the tip of the probe needle 48. The volatile solvent is evaporated by means of visible rays (irradiating rays) irradiated by the observation device 43 and a mark consisting of the coloring agent will be formed surrounding the fault location.

Thus, the detection unit 41, the measuring unit 46, the positioning mechanism 49, the solution supply device 50 and the control unit 51 are also the guide needle 11 and the heating unit 14, the positioning mechanism 12, the solution supply device 13 and the control unit 19 according to the first embodiment, respectively.

The analyzing apparatus 40 according to the second embodiment as aforesaid has the mark forming apparatus built in so that it can form marks on fault locations without affecting electrical characteristics of semiconductor devices.

Also, the device added for marking is essentially only the solution supply device 50. Therefore, the analyzing apparatus 40 can be manufactured easily and the analyzing apparatus 40 can be supplied inexpensively.

Since the analyzing apparatus and the mark forming apparatus are integrated, and marking is performed inside the analyzing apparatus. Therefore, there is no need to move the semiconductor device where the fault location is identified in it between apparatuses for the purpose of marking. Thus, the marking of fault location can be more accurately and easily done.

It is obvious that this invention is not limited to the particular embodiments shown and described above but may be variously changed and modified without departing from the technical concept of this invention.

This application is based on Japanese patent application No. 2000-391074 filed on Dec. 22, 2000, the contents of which are hereby incorporated by reference.

I claim:

1. A mark forming apparatus comprising:
   a guide needle for forming a mark;
   a positioning mechanism for positioning said guide needle above a fault location of a semiconductor device;
   a solution supply device independent from said guide needle, for supplying a solution containing a coloring agent and a volatile solvent above the fault location from outside of the guide needle and toward the tip of said guide needle until said solution touches the tip of said guide needle; and
   a heating unit for evaporating the volatile solvent to form a mark consisting of the coloring agent surrounding the fault location.

2. A mark forming apparatus as claimed in claim 1, in which said volatile solvent is any one of ketone, ether and alcohol.

3. A mark forming apparatus as claimed in claim 1, in which said volatile solvent is lower alcohol.

4. A mark forming apparatus as claimed in claim 1, in which said heating unit comprises an irradiating device for irradiating visible rays, and the evaporation of the volatile solvent is caused by irradiation of the visible rays.

5. A mark forming apparatus as claimed in claim 4, in which said irradiating device comprises a light source for generating visible rays and an optical system with an objective lens.

6. A mark forming apparatus as claimed in claim 1, in which said guide needle is a probe needle.

7. A mark forming method comprising the steps of:
   positioning a guide needle for forming a mark above a fault location of a semiconductor device;
   supplying a solution containing a coloring agent and a volatile solvent above the fault location from outside of said guide needle toward the tip of said guide needle with a means independent from said guide needle, until said solution touches a the tip of the guide needle; and
   evaporating the volatile solvent to form a mark consisting of the coloring agent surrounding the fault location.

8. A mark forming method as claimed in claim 7, in which said volatile solvent is any one of ketone, ether and alcohol.

9. A mark forming method as claimed in claim 7, in which said volatile solvent is lower alcohol.

10. A mark forming method as claimed in claim 7, in which said evaporation of the volatile solvent in said step of forming a mark surrounding the fault location is caused by irradiation of visible rays.

11. A mark forming method as claimed in claim 10, in which said visible rays are irradiated through an optical system comprising an objective lens.

12. A mark forming method as claimed in claim 7, in which said guide needle is a probe needle.

13. An analyzing apparatus comprising:
    a probe needle for detecting a fault location of a semiconductor device;
    an observation device for observing and identifying a location of said probe needle;
    a positioning mechanism for positioning said probe needle above the fault location as detected;
    a solution supply device independent from said guide probe, for supplying a solution containing a coloring agent and a volatile solvent above the fault location from outside of said probe needle toward the tip of said probe needle until said solution touches the tip of said probe needle; and
    a heating unit for evaporating the volatile solvent to form a mark consisting of the coloring agent surrounding the fault location.

14. An analyzing apparatus as claimed in claim 13, in which said volatile solvent is any one of ketone, ether and alcohol.

15. An analyzing apparatus as claimed in claim 13, in which said volatile solvent is lower alcohol.

16. An analyzing apparatus as claimed in claim 13, in which said observation device comprises a light source for generating visible rays and an optical system with an objective lens.

17. An analyzing apparatus as claimed in claim 13, in which said observation device comprises a microscope with a light source for generating visible rays and an optical system with an objective lens.

18. An analyzing apparatus as claimed in claim 13, in which said heating unit comprises an irradiating device for irradiating visible rays, and the evaporation of the volatile solvent is caused by irradiation of the visible rays.

19. An analyzing apparatus as claimed in claim 18, in which said irradiating device comprises a light source for generating visible rays and an optical system with an objective lens.

20. An analyzing apparatus as claimed in claim 19, in which said irradiating device also serves as said observation device.

* * * * *